(12) United States Patent
Moon et al.

(10) Patent No.: US 12,058,923 B2
(45) Date of Patent: Aug. 6, 2024

(54) MASK REPAIRING APPARATUS AND MASK REPAIRING METHOD USING THE SAME

(71) Applicant: Samsung Display Co., Ltd., Yongin-Si (KR)

(72) Inventors: Youngmin Moon, Yongin-si (KR); Minho Moon, Seongnam-si (KR); Seungyong Song, Suwon-si (KR); Sungsoon Im, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 451 days.

(21) Appl. No.: 17/336,543

(22) Filed: Jun. 2, 2021

(65) Prior Publication Data

US 2022/0093864 A1 Mar. 24, 2022

(30) Foreign Application Priority Data

Sep. 18, 2020 (KR) .................. 10-2020-0120539

(51) Int. Cl.
*H10K 71/16* (2023.01)
*B23K 26/38* (2014.01)
*H10K 71/00* (2023.01)

(52) U.S. Cl.
CPC .......... *H10K 71/166* (2023.02); *B23K 26/38* (2013.01); *H10K 71/00* (2023.02); *H10K 71/164* (2023.02); *H10K 71/861* (2023.02)

(58) Field of Classification Search
CPC ........ B23K 26/36; B23K 26/38; B23K 26/16; B23K 2101/40; B23K 26/702; B23K 37/0408; B23K 26/21; B23K 26/142; H10K 71/166; H10K 71/00; H10K 71/164; H10K 71/861; C23C 14/042; C23C 14/24
See application file for complete search history.

(56) References Cited

U.S. PATENT DOCUMENTS

| 4,727,234 | A | * | 2/1988 | Oprysko | .................. G03F 1/56 |
| | | | | | 427/140 |
| 4,963,921 | A | * | 10/1990 | Kariya | ...................... G03F 1/22 |
| | | | | | 355/53 |
| 6,179,990 | B1 | * | 1/2001 | Galasco | ................. C23G 1/083 |
| | | | | | 204/196.01 |
| 9,142,459 | B1 | * | 9/2015 | Kumar | ............... H01L 21/3065 |
| 10,065,808 | B2 | | 9/2018 | Ohno et al. | |

(Continued)

FOREIGN PATENT DOCUMENTS

| CN | 111482700 A | 8/2020 |
| JP | 6341434 B2 | 6/2018 |

(Continued)

OTHER PUBLICATIONS

Extended European Search Report for Application No. 21197569. 3-1016 dated Feb. 21, 2022.

*Primary Examiner* — John P. Dulka
(74) *Attorney, Agent, or Firm* — CANTOR COLBURN LLP

(57) ABSTRACT

A mask repairing apparatus includes a laser which emits a laser beam toward a welding portion between an opening sheet disposed on a mask frame and a cell mask disposed on the opening sheet, a fixing part disposed below the opening sheet to fix the opening sheet, and a suction part adjacent to the laser. The cell mask is separated from the opening sheet by the laser beam.

20 Claims, 16 Drawing Sheets

(56) References Cited

U.S. PATENT DOCUMENTS

| | | | | |
|---|---|---|---|---|
| 2004/0087112 | A1* | 5/2004 | Liu | B23K 26/40 |
| | | | | 438/460 |
| 2011/0266140 | A1* | 11/2011 | Kinoshita | G03F 7/70708 |
| | | | | 204/192.27 |
| 2014/0312546 | A1 | 10/2014 | Lee et al. | |
| 2016/0221017 | A1* | 8/2016 | Huang | B29C 43/52 |
| 2017/0210115 | A1* | 7/2017 | Ohno | H01L 27/1225 |
| 2018/0065162 | A1* | 3/2018 | Mikami | B21B 3/02 |
| 2020/0199732 | A1* | 6/2020 | Kudo | B23K 26/38 |
| 2022/0020614 | A1* | 1/2022 | Masuda | H01L 21/6836 |
| 2022/0255049 | A1* | 8/2022 | Moon | B23K 26/364 |

FOREIGN PATENT DOCUMENTS

| | | |
|---|---|---|
| KR | 1020110013854 A | 2/2011 |
| KR | 101867467 B1 | 6/2018 |

* cited by examiner

MASK REPAIRING APPARATUS AND MASK REPAIRING METHOD USING THE SAME

This application claims priority to Korean Patent Application No. 10-2020-0120539, filed on Sep. 18, 2020, and all the benefits accruing therefrom under 35 U.S.C. § 119, the content of which in its entirety is herein incorporated by reference.

BACKGROUND

The present disclosure herein relates to a mask repairing apparatus and a mask repairing method using the same.

An organic light emitting diode display ("OLEDs"), which generally has excellent luminance and viewing angle characteristics and does not require a separate light source unit unlike liquid crystal displays, has attracted much attention as next-generation flat panel displays. Since the OLED does not require a separate light source, the OLED may be manufactured to be reduced in weight and thickness. Also, the OLED has characteristics such as low power consumption, high luminance, and a high reaction speed.

The OLED includes a plurality of light emitting elements, each of which includes an anode, a light emitting layer, and a cathode. An exciton is formed as holes and electrons from the anode and the cathode are injected into the light emitting layer, and the light emitting elements emit light while the exciton is transitioned to a ground state. When the light emitting elements are manufactured, a mask is disposed above a substrate, and organic materials for forming the light emitting layers are provided on the substrate through openings of the mask.

SUMMARY

The present disclosure provides a mask repairing apparatus for easily removing a defective cell mask and a mask repairing method using the same.

An embodiment of the inventive concept provides a mask repairing apparatus including: a laser which emits a laser beam toward a welding portion between an opening sheet disposed on a mask frame and a cell mask disposed on the opening sheet; a fixing part disposed below the opening sheet to fix the opening sheet; and a suction part adjacent to the laser, wherein the cell mask is separated from the opening sheet by the laser beam.

In an embodiment of the inventive concept, a mask repairing method includes: disposing a fixing part, which is to fix an opening sheet, in a first opening portion defined in a mask frame, wherein the mask frame is disposed below the opening sheet; removing a removal portion of a defective cell mask by emitting a laser beam toward the removal portion which overlaps a welding portion between the opening sheet and the defective cell mask disposed on the opening sheet; removing the welding portion by emitting the laser beam to the welding portion; separating the defective cell mask from the opening sheet; and connecting a normal cell mask to the opening sheet.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

Figure 1:
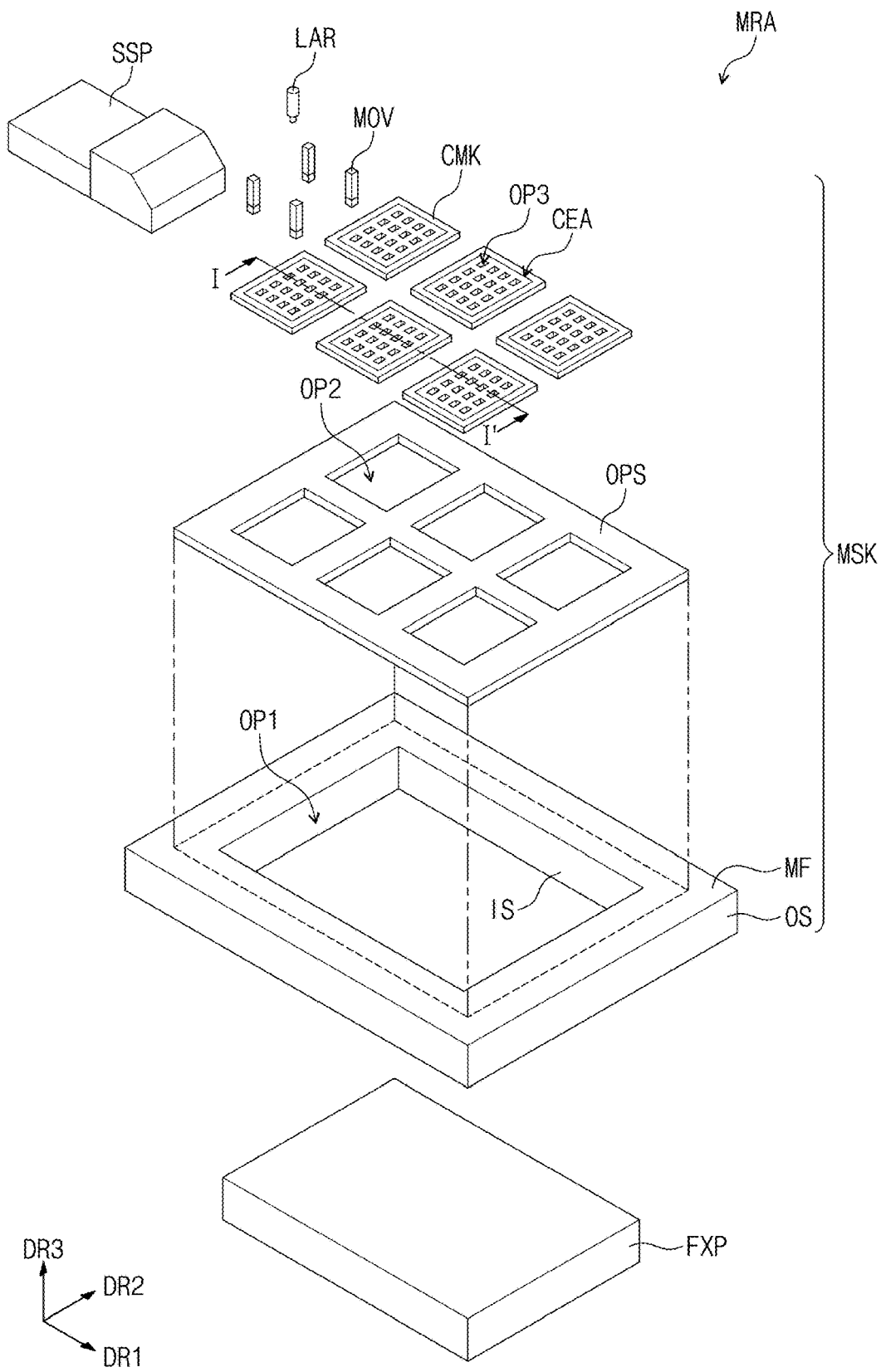
FIG. 1 is a perspective view of a mask repairing apparatus and a mask to be repaired according to an embodiment of the inventive concept.

In the specification, it will be understood that when an element (or a region, a layer, a portion, or the like) is referred to as being "on", "connected to" or "coupled to" another element in the specification, it can be directly disposed on, connected or coupled to another element mentioned above, or intervening elements may be disposed therebetween.

Like numbers refer to like elements throughout. Also, in the drawings, the thicknesses, ratios, and dimensions of the elements are exaggerated for effective description of the technical contents. It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." The term "and/or" includes any and all combinations of one or more of the associated listed items.

It will be understood that, although the terms first, second, etc. may be used herein to describe various elements, these elements should not be limited by these terms. These terms are only used to distinguish one element from another element. For example, a first element may be referred to as a second element, and similarly, a second element may be referred to as a first element without departing from the scope of the present disclosure. The singular forms include the plural forms unless the context clearly indicates otherwise.

Also, terms such as "below", "lower", "above", and "upper" may be used to describe the relationships of the components illustrated in the drawings. These terms have a relative concept and are described on the basis of the directions indicated in the drawings.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be understood that the term "includes" or "comprises", when used in this specification, specifies the presence of stated features, integers, steps, operations, elements, components, or a combination thereof, but does not preclude the presence or addition of one or more other features, integers, steps, operations, elements, components, or combinations thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value. Hereinafter, embodiments of the inventive concept will be described in detail with reference to the accompanying drawings.

FIG. 1 is a perspective view of a mask repairing apparatus and a mask to be repaired according to an embodiment of the inventive concept.

Referring to FIG. 1, a mask repairing apparatus MRA according to an embodiment of the inventive concept may include a fixing part FXP, a laser LAR, a suction part SSP, and a plurality of conveying units MOV. A mask MSK may be repaired by the fixing part FXP, the laser LAR, and the suction part SSP, and a repairing operation for the mask MSK will be described in detail later.

In an embodiment, for example, the mask MSK may be used to form a light emitting element of a display device. The mask MSK may include a mask frame MF, an opening sheet OPS, and a plurality of cell masks CMK. The cell masks CMK may be defined as deposition masks.

The mask frame MF may have a quadrangular shape which has side surfaces extending in a first direction DR1 and side surfaces extending in a second direction DR2 crossing the first direction DR1. The mask frame MF may have a quadrangular frame shape, but the shape of the mask frame MF according to the invention is not limited thereto.

A first opening portion OP1 is defined in the mask frame MF. The first opening portion OP1 may have a quadrangular shape, but the shape of the first opening portion OP1 according to the invention is not limited thereto. An outer surface OS of the mask frame MF on the opposite side from an inner surface IS of the mask frame MF that defines the first opening portion OP1 may be defined as an edge of the mask frame MF.

The mask frame MF may include a metal material. For example, the mask frame MF may include invar or stainless steel.

Hereinafter, a third direction DR3 is defined as a direction that crosses the plane defined by the first and the second directions DR1 and DR2. Substantially, the third direction DR3 may perpendicularly cross the plane defined by the first and the second directions DR1 and DR2. In this description, the meaning of "when viewed in a plan view" may represent a state when viewed in the third direction DR3. The third direction DR3 may also be referred as thickness direction of an element.

The opening sheet OPS may be disposed on the mask frame MF. The opening sheet OPS may have a major surface plane defined by the first and second directions DR1 and DR2. The opening sheet OPS may have a quadrangular shape which has side surfaces extending in the first direction DR1 and side surfaces extending in the second direction DR2, but the shape of the opening sheet OPS according to the invention is not limited thereto.

The opening sheet OPS may be welded to the mask frame MF by a welding process. For example, a portion of the opening sheet OPS adjacent to an edge of the opening sheet OPS may be connected to the mask frame MF by laser welding. The opening sheet OPS may be supported by the mask frame MF.

A plurality of second opening portions OP2 may be defined in the opening sheet OPS. The second opening portions OP2 may be arranged in the first direction DR1 and the second direction DR2. The second opening portions OP2 may overlap the first opening portion OP1 when viewed in a plan view. Each of the second opening portions OP2 may have a quadrangular shape, but the shape of the second opening portion OP2 according to the invention is not limited thereto.

With respect to the third direction DR3, the opening sheet OPS may have a thickness less than that of the mask frame MF. For example, the opening sheet OPS may have a thickness of about 100 micrometers (μm) to about 200 micrometers (μm). The opening sheet OPS may include a metal material. For example, the opening sheet OPS may include invar or stainless steel.

The cell masks CMK may be disposed on the opening sheet OPS. Each of the cell masks CMK may have a major surface plane defined by the first and second directions DR1 and DR2. Each of the cell masks CMK may have a quadrangular shape which has side surfaces extending in the first direction DR1 and side surfaces extending in the second direction DR2, but the shape of the cell mask CMK according to the invention is not limited thereto.

The cell masks CMK may be connected to the opening sheet OPS by a welding process. For example, portions of the cell masks CMK adjacent to edges of the cell masks CMK may be connected to the opening sheet OPS by laser welding. The cell masks CMK may be supported by the opening sheet OPS.

The cell masks CMK may be arranged in the first direction DR1 and the second direction DR2. The cell masks CMK may be disposed to correspond to the second opening portions OP2, respectively. For example, each of the cell masks CMK may be disposed on the corresponding second opening portion OP2 among the plurality of second opening portions OP2. Thus, when viewed in a plan view, each of the cell masks CMK may be disposed to overlap the corresponding second opening portion OP2 among the plurality of second opening portions OP2 in the plan view.

A cell area CEA may be defined in each of the cell masks CMK. When viewed in a plan view, the cell area CEA of each of the cell masks CMK may be disposed to overlap the corresponding second opening portion OP2 among the plurality of second opening portions OP2. The cell areas CEA may have shapes corresponding to those of the second opening portions OP2. For example, each of the cell areas CEA may have a quadrangular shape.

A plurality of third opening portions OP3 may be defined in each of the cell masks CMK. In particular, the plurality of third opening portions OP3 may be defined in each of the cell areas CEA of the cell masks CMK. The third opening portions OP3 may be arranged in the first direction DR1 and the second direction DR2. The third opening portions OP3 may overlap the second opening portions OP2 when viewed in a plan view. For example, each of the third opening portions OP3 may have a quadrangular shape, but the shape of the third opening portion OP3 according to the invention is not limited thereto.

With respect to the third direction DR3, each of the cell masks CMK may have a thickness less than that of the opening sheet OPS. For example, each of the cell masks CMK may have a thickness of about 10 micrometers (μm) to about 25 micrometers (μm). The cell masks CMK may include a metal material. For example, the cell masks CMK may include invar or stainless steel. The cell masks CMK may be supported by the opening sheet OPS.

The fixing part FXP may be disposed below the opening sheet OPS. The fixing part FXP may be disposed in the first opening portion OP1. The fixing part FXP may fix the opening sheet OPS. A structure of the fixing part FXP will be described in detail later.

The laser LAR may generate a laser beam and emit the generated laser beam to a defective cell mask among the cell masks CMK. The defective cell mask may be separated from the opening sheet OPS by the laser LAR. An operation of the laser LAR will be described in detail later.

The suction part SSP may generate a suction force. The suction part SSP may suction and remove particles generated when the defective cell mask is irradiated by the laser LAR. The conveying units MOV may remove the defective cell mask separated from the opening sheet OPS. The operations of the suction part SSP and the conveying units MOV will be described in detail later.

Figure 2:
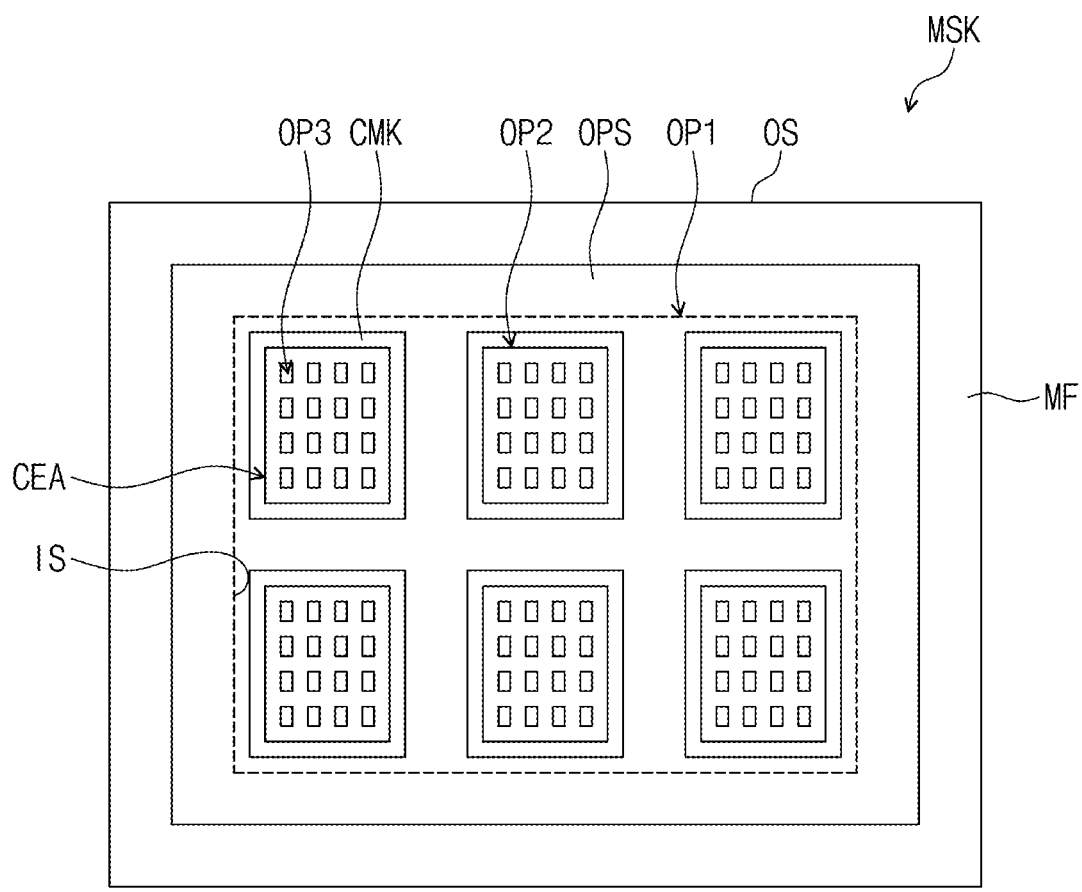
FIG. 2 is a plan view of the mask illustrated in FIG. 1.

FIG. 2 is a plan view of the mask illustrated in FIG. 1.

Referring to FIG. 2, when viewed in a plan view, an edge of the opening sheet OPS may be disposed between the outer surface OS of the mask frame MF and the inner surface IS of the mask frame MF. When viewed in a plan view, the second opening portions OP2 defined in the opening sheet OPS may overlap the first opening portion OP1.

When viewed in a plan view, the cell masks CMK may overlap the first opening portion OP1. The cell areas CEA of the cell masks CMK may overlap the first opening portion OP1.

When viewed in a plan view, the cell masks CMK may overlap the second opening portions OP2, respectively. The cell areas CEA of the cell masks CMK may overlap the second opening portions OP2, respectively. When viewed in a plan view, the third opening portions OP3 defined in each of the cell areas CEA may overlap the corresponding second opening portion OP2 among the plurality of second opening portions OP2.

Figure 3:
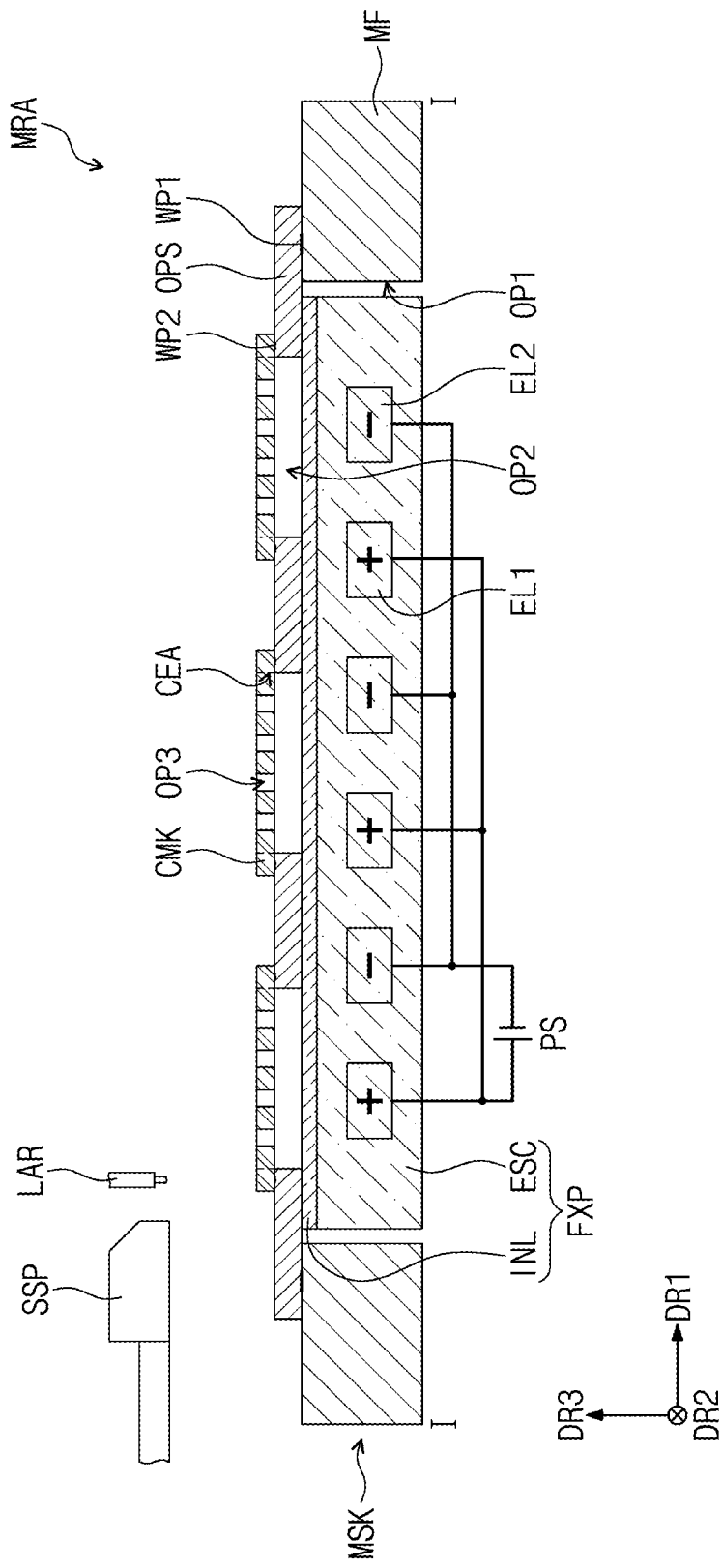
FIG. 3 is a cross-sectional view taken along line I-I' illustrated in FIG. 1.

FIG. 3 is a cross-sectional view taken along line I-I' illustrated in FIG. 1.

Referring to FIG. 3, the opening sheet OPS may be disposed on the mask frame MF and connected to the mask frame MF so that the second opening portions OP2 overlap the first opening portion OP1 in a plan view. A plurality of first welding portions WP1 may be disposed between the opening sheet OPS and the mask frame MF. The opening sheet OPS may be connected to the mask frame MF by the first welding portions WP1.

A laser beam is emitted to the first welding portions WP1 between the opening sheet OPS and the mask frame MF, and through this laser welding, the opening sheet OPS and the mask frame MF may be coupled to each other.

The cell masks CMK may be disposed on the opening sheet OPS and connected to the opening sheet OPS so that the cell areas CEA overlap the second opening portions OP2 in a plan view, respectively. A plurality of second welding portions WP2 may be disposed between the cell masks CMK and the opening sheet OPS. The cell masks CMK may be connected to the opening sheet OPS by the second welding portions WP2.

A laser beam is emitted to the second welding portions WP2 between the opening sheet OPS and the cell masks CMK, and through this laser welding, the opening sheet OPS and the cell masks CMK may be coupled to each other.

Below the opening sheet OPS, the fixing part FXP may be disposed in the first opening portion OP1 defined in the mask frame MF. The fixing part FXP may support the opening sheet OPS. In particular, the fixing part FXP may support the opening sheet OPS to prevent the opening sheet OPS from being deflected downward.

The fixing part FXP may stably support the opening sheet OPS to prevent the opening sheet OPS from moving. For example, the fixing part FXP may generate an electrostatic force to fix the opening sheet OPS.

The fixing part FXP may include an electrostatic chuck ESC and an insulating layer INL disposed on the electrostatic chuck ESC. The insulating layer INL may be disposed between the electrostatic chuck ESC and the opening sheet OPS. The insulating layer INL may insulate the opening sheet OPS from the electrostatic chuck ESC. The electrodes ESC may generate an electrostatic force.

The electrostatic chuck ESC may include a plurality of first electrodes EL1 and a plurality of second electrodes EL2. The first electrodes EL1 and the second electrodes EL2 may be disposed alternately in the first direction DR1. The first electrodes EL1 and the second electrodes EL2 may receive voltages having different polarities. The first electrodes EL1 may be connected to a first terminal of a power supply PS having a positive polarity, and the second electrode EL2 may be connected to a second terminal of the power supply PS having a negative polarity.

When voltage of the power supply PS is applied to the first and second electrodes EL1 and EL2, the first electrodes EL1 may have the positive polarity, and the second electrodes EL2 may have the negative polarity. However, this is described as an example. The first electrodes EL1 may have the negative polarity, and the second electrodes EL2 may have the positive polarity in another embodiment.

The electrostatic force may be generated by the first electrodes EL1 and the second electrodes EL2 having different polarities. The opening sheet OPS may be fixed to the electrostatic chuck ESC by the electrostatic force generated from the electrostatic chuck ESC. The opening sheet OPS may be adhered and fixed to the top surface of the insulating layer INL by an attractive force due to the electrostatic force.

The electrostatic chuck ESC is illustrated as an example, but the embodiment of the inventive concept is not limited thereto. In another embodiment, for example, the fixing part FXP may include a magnet instead of the electrostatic chuck ESC. In this case, the opening sheet OPS may be fixed by a magnetic force generated from the magnet.

The laser LAR may be disposed above the cell masks CMK. The laser LAR may be disposed above a defective cell mask among the cell masks CMK. The exemplary shape of the defective cell mask will be described in FIG. 6 below. The laser LAR may generate a laser beam and emit the laser beam to the defective cell mask. The operation thereof will be described in detail later. For example, the laser LAR may include one of a green laser, a femtosecond laser, or a picosecond laser.

The suction part SSP may be disposed above the cell masks CMK. The suction part SSP may be adjacent to the laser LAR. The suction part SSP may be adjacent to the laser LAR and generate a predetermined suction force.

Figure 4:
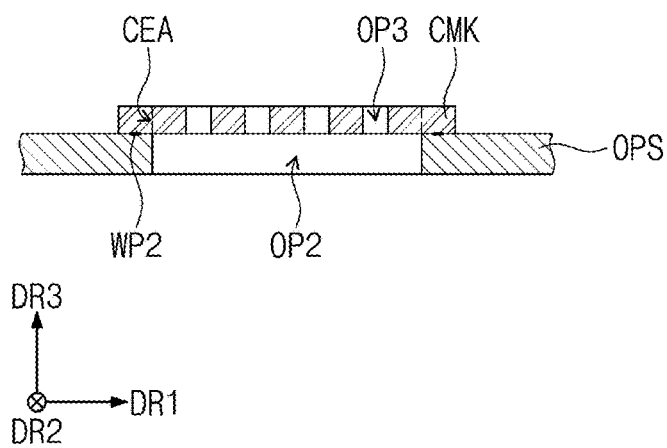
FIG. 4 is a cross-sectional view of one cell mask and the opening sheet overlapping the cell mask illustrated in FIG. 3.
Figure 5:
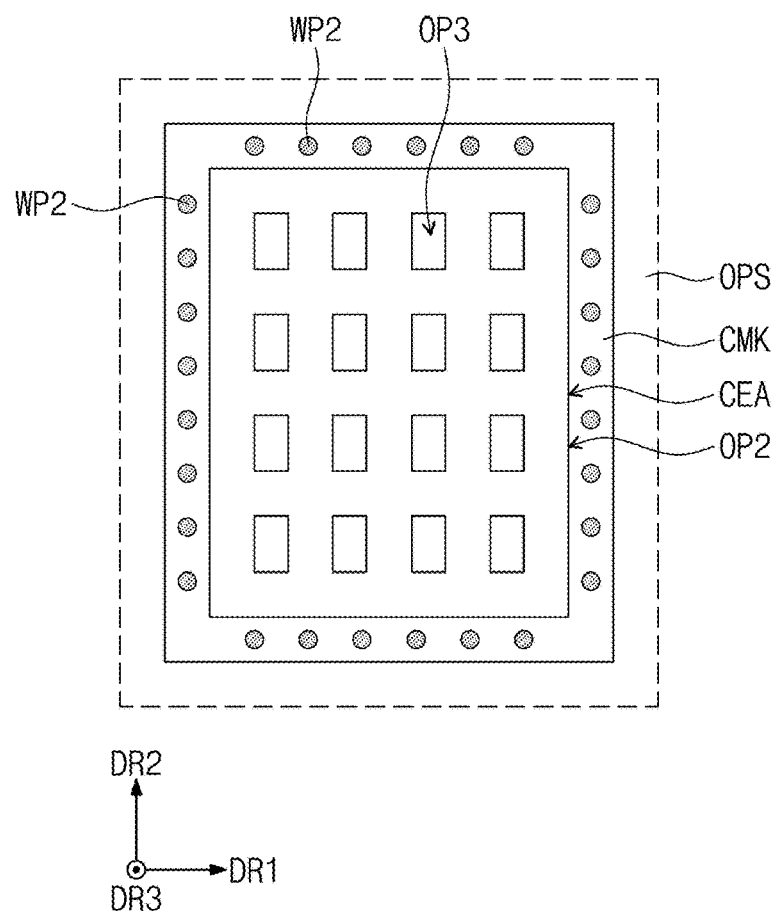
FIG. 5 is a plan view of the cell mask and the opening sheet illustrated in FIG. 4.

FIG. 4 is a cross-sectional view of one cell mask and the opening sheet overlapping the cell mask illustrated in FIG. 3. FIG. 5 is a plan view of the cell mask and the opening sheet illustrated in FIG. 4.

Referring to FIGS. 4 and 5, the second welding portions WP2 formed between the opening sheet OPS and the cell mask CMK may be adjacent to the edge of the cell mask CMK when viewed in a plan view. When viewed in a plan view, the second welding portions WP2 may be disposed between the edge of the cell mask CMK and a border of the cell area CEA of the cell mask CMK. That is, the second welding portions WP2 may be disposed in the outside of the third opening portions OP3.

When viewed in a plan view, the second welding portions WP2 may be arranged along the edge of the cell mask CMK. The second welding portions WP2 may be spaced apart from each other along the edge of the cell mask CMK. The second welding portions WP2 may be arranged in a dot-type.

By the second welding portions WP2, the cell mask CMK and the opening sheet OPS may be connected to each other. That is, the cell mask CMK and the opening sheet OPS may be partially connected.

FIGS. 6 to 13 are views for explaining a mask repairing method using the mask repairing apparatus illustrated in FIG. 1.

Figure 6:
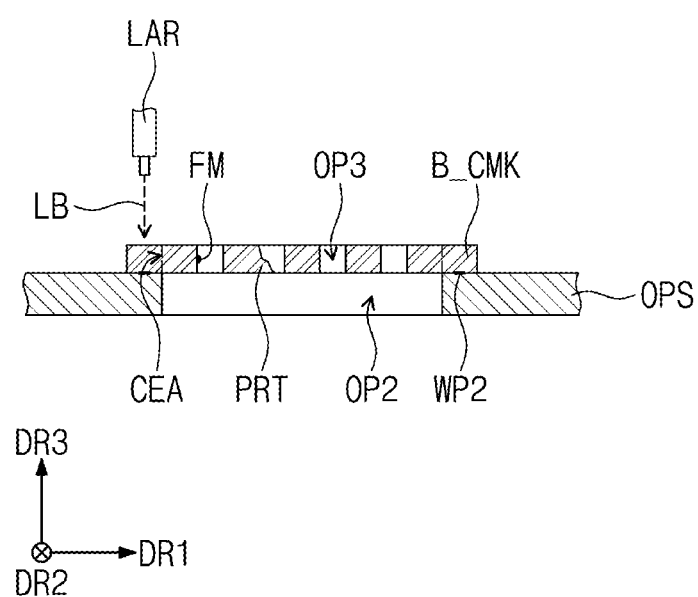
FIGS. 6 to 13 are views for explaining a mask repairing method using the mask repairing apparatus illustrated in FIG. 1.

Referring to FIG. 6, cell masks CMK may include a defective cell mask B_CMK. For example, in the cell mask CMK, a foreign material FM may be present in a third opening portion OP3. Also, the third opening portion OP3 may not be formed normally, and a protrusion PRT may be formed in the third opening portion OP3. That is, a cell mask, which has a third opening portion having a shape different from those of normal third opening portions OP3, may be defined as the defective cell mask B_CMK.

When the defective cell mask B_CMK is used, a light emitting element may not be normally manufactured. A mask repairing apparatus MRA according to an embodiment of the inventive concept may be used to remove the defective cell mask B_CMK.

A laser LAR may generate a laser beam LB. The laser beam LB may be emitted toward second welding portions WP2.

Figure 7:
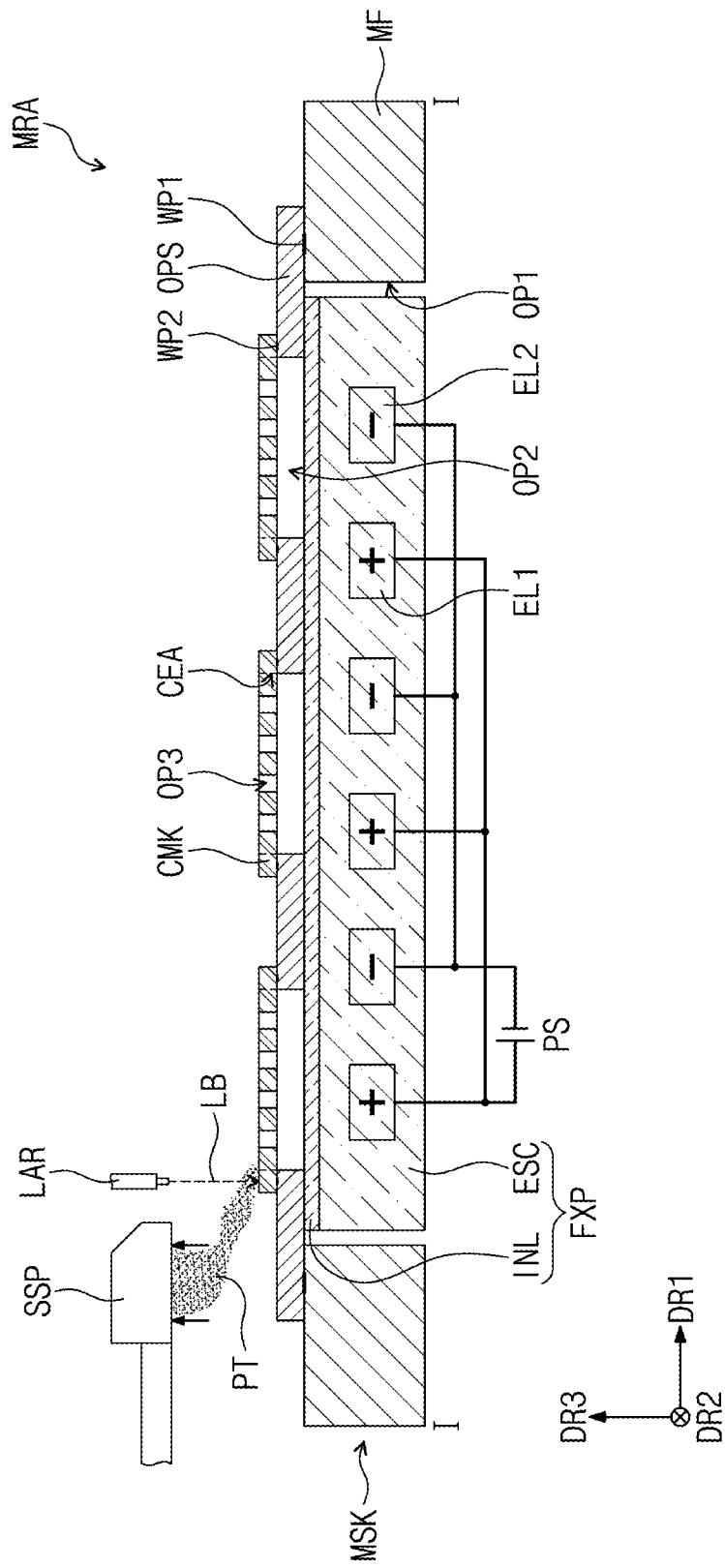

Referring to FIG. 7, the laser beam LB generated in the laser LAR may be emitted to the second welding portions WP2 and to portions of the defective cell mask B_CMK on the second welding portions WP2. The second welding portions WP2 and the portions of the defective cell mask B_CMK on the second welding portions WP2 may be removed by the laser beam LB.

A suction part SSP may be disposed adjacent to the laser LAR and generate a suction force. When the laser beam LB removes the portions of the defective cell mask B_CMK and the second welding portions WP2, particles may be generated. The particles may be suctioned into the suction part SSP and removed.

Figure 8:
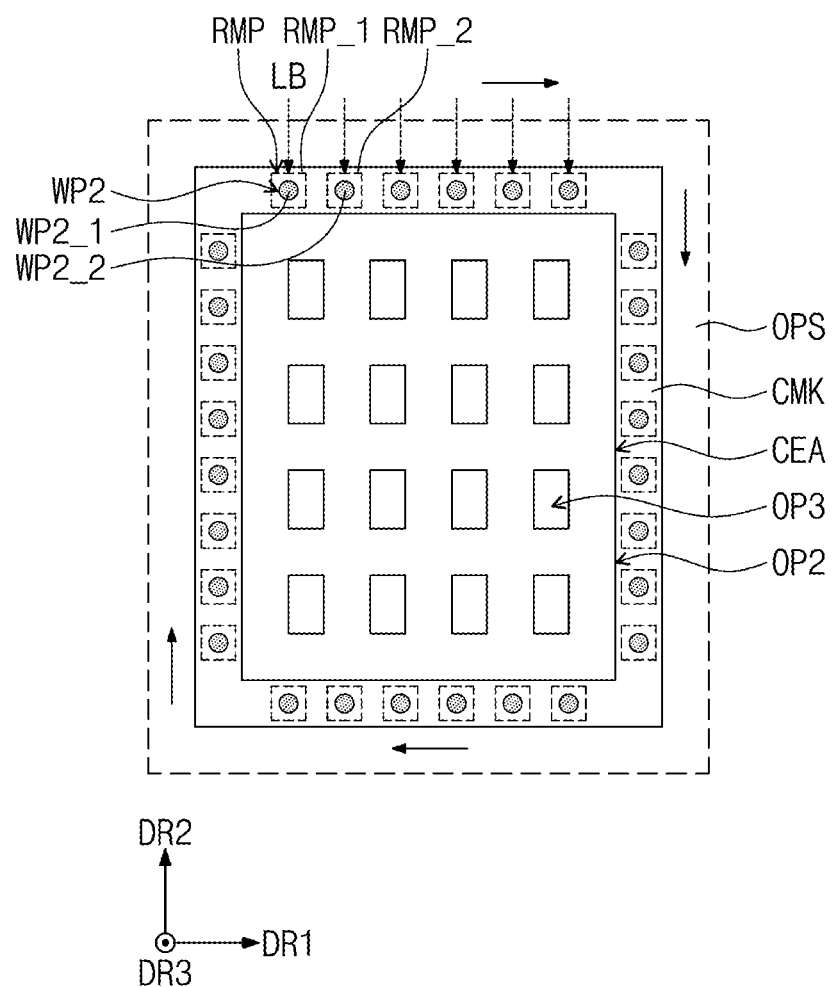

FIG. 8 is a view illustrating the portions of the cell mask irradiated with the laser beam.

FIG. 8 illustratively shows a plan view corresponding to FIG. 5. A cell mask CMK illustrated in FIG. 8 may be a defective cell mask.

Referring to FIG. 8, removal portions RMP overlapping the second welding portions WP2 may be defined in the cell mask CMK when viewed in a plan view. Each of the removal portions RMP may be defined as a quadrangular dot-type, but the shape of the removal portions RMP according to the invention is not limited thereto. The laser beam LB may be emitted to the removal portions RMP and the second welding portions WP2. The removal portions RMP of the cell mask CMK and the second welding portions WP2 may be removed by the laser beam LB.

The removal portions RMP and the second welding portions WP2 may be removed sequentially by the laser beam LB. The laser beam LB is emitted to an h-th removal portion RMP and an h-th second welding portion WP2, and thus, the h-th removal portion RMP and the h-th second welding portion WP2 may be removed. Subsequently, the laser beam LB is emitted to a (h+1)th removal portion RMP and a (h+1)th second welding portion WP2, and thus, the (h+1)th removal portion RMP and the (h+1)th second welding portion WP2 may be removed. Here, h is a natural number. The (h+1)th removal portion RMP is adjacent to the h-th removal portion RMP.

For example, when h is 1, a first removal portion RMP_1 and a first second-welding portion WP2_1 are removed by the laser beam LB, and then, a second removal portion RMP_2 and a second second-welding portion WP2_2 are removed by the laser beam LB. In FIG. 8, the order of the removal is clockwise (See directions of solid arrows). However, this is described as an example, and the removal portions RMP and the second welding portions WP2 may be removed in a random order in another embodiment of the inventive concept.

Each of the removal portions RMP is illustratively shown as having a larger area than each of the second welding portions WP2, but the embodiment of the inventive concept is not limited thereto. Each of the removal portions RMP may be defined as having the same area as each of the second welding portions WP2 in another embodiment.

Figure 9:
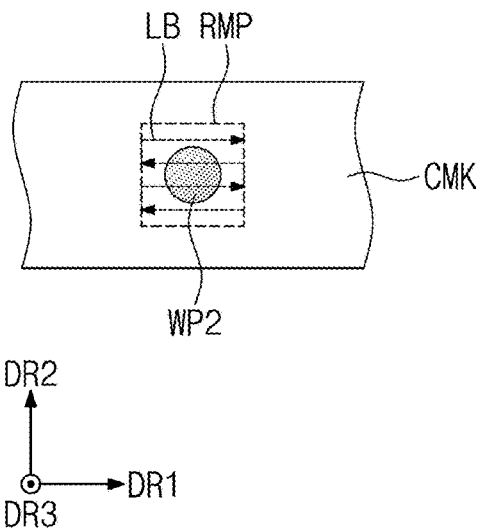
Figure 10:
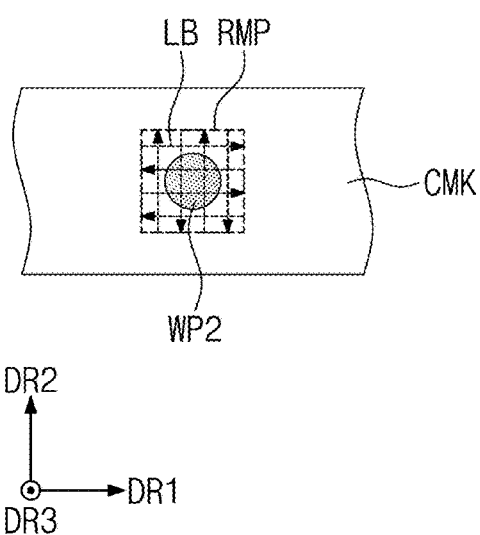

FIG. 9 and FIG. 10 are views illustratively showing a moving direction of the laser beam which is emitted to one removal portion and one second welding portion illustrated in FIG. 8.

Referring to FIG. 9, the laser beam LB may reciprocate in a first direction DR1 and be emitted to the removal portion RMP. The laser LAR may reciprocate in the first direction DR1 and emit the laser beam LB to the removal portion RMP. The laser beam LB may reciprocate in the first direction DR1 while moving in a second direction DR2, and be emitted to the removal portion RMP.

Referring to FIG. 10, subsequently, the laser beam LB may reciprocate in the second direction DR2 and be emitted to the removal portion RMP. The laser LAR may reciprocate in the second direction DR2 and emit the laser beam LB to the removal portion RMP. The laser beam LB may reciprocate in the second direction DR2 while moving in the first direction DR1, and be emitted to the removal portion RMP.

Referring to FIGS. 9 and 10, the laser beam LB may be emitted to the entire removal portion RMP while reciprocating in the first and second directions DR1 and DR2. However, the embodiment of the inventive concept is not limited thereto. For example, when the laser beam LB is sufficiently emitted to the entire removal portion RMP while reciprocating in the first direction DR1, the laser beam LB may not reciprocate in the second direction DR2 in another embodiment.

FIG. 11A to FIG. 11D are views sequentially illustrating states in which the one removal portion and the one second welding portion illustrated in FIG. 8 are removed by the laser beam.

Figure 11A:
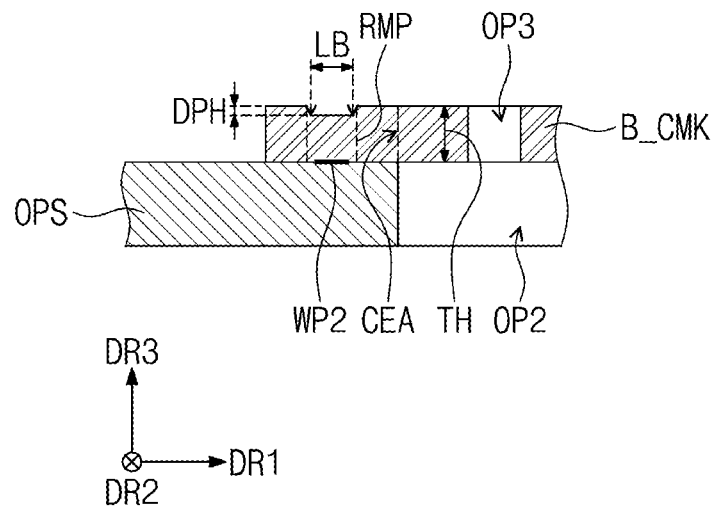

Referring to FIG. 11A, the laser beam LB may be emitted several times to the entire area of the removal portion RMP while reciprocating in the first and second directions DR1 and DR2. For example, when the laser beam LB is emitted one time to the entire area of the removal portion RMP by reciprocating in the first and second directions DR1 and DR2, the defective cell mask B_CMK may be removed by a first depth DPH (in other words, "one-time-removal depth") in a depth direction.

The depth direction may be a third direction DR3 (i.e., thickness direction). The depth direction may be a direction from the top surface to the bottom surface of the defective cell mask B_CMK.

The defective cell mask B_CMK may have a first thickness TH in the thickness direction, and the first depth DPH may be less than the first thickness TH. For example, the first thickness TH may be about 10 micrometers (μm) to about 20 micrometers (μm), and the first depth DPH may be about 0.1 micrometers (μm) to about 5 micrometers (μm).

Figure 11B:
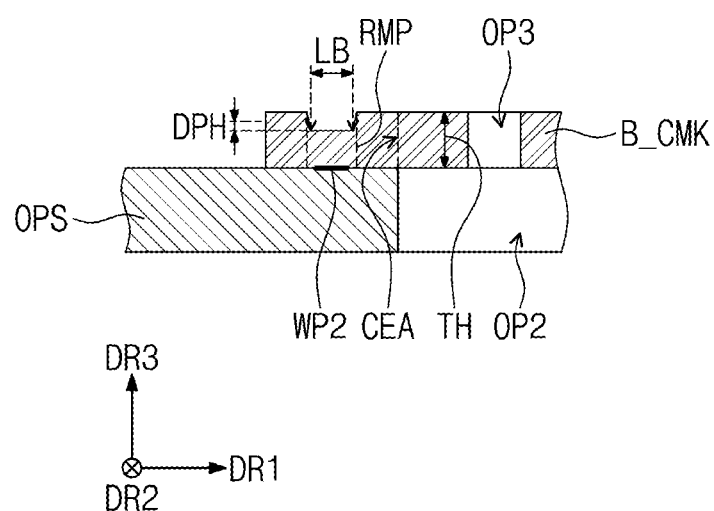

Referring to FIG. 11B, subsequently, the laser beam LB is emitted once again to the entire area of the removal portion RMP, and thus, the cell mask CMK may be further removed by the first depth DPH. For example, it is exemplarily described that the same amount corresponding to the first depth DPH is removed each time the laser beam LB is emitted once, but the depth being removed according to the invention may vary each time the laser beam LB is emitted once in another embodiment.

Figure 11C:
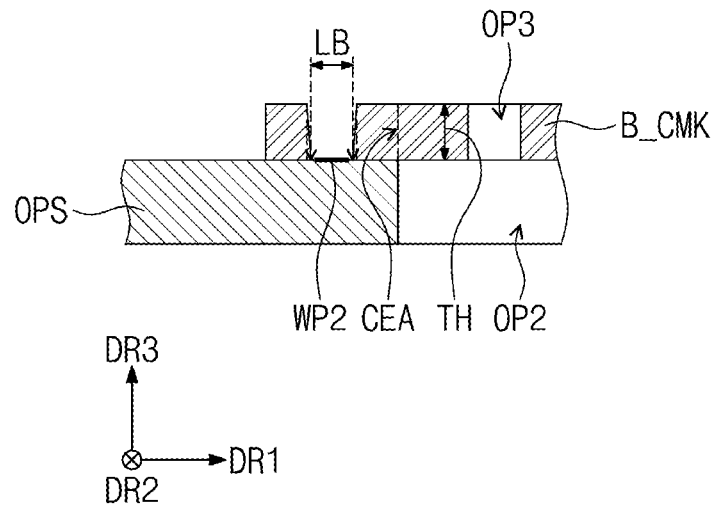
Figure 11D:
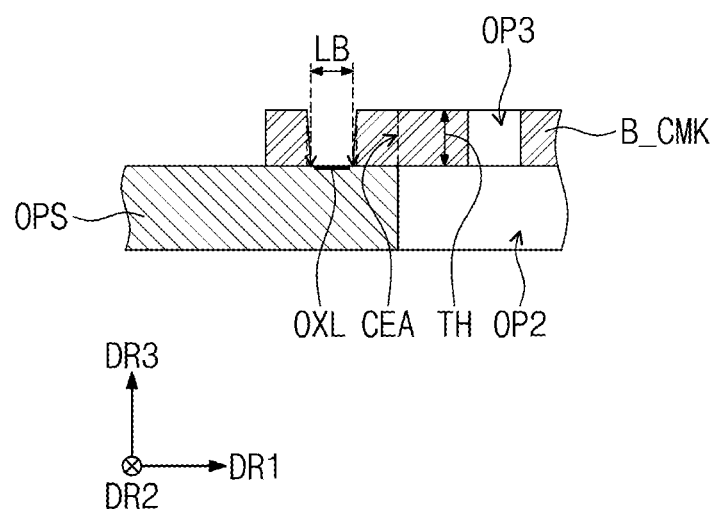

Referring to FIGS. 11C and 11D, the laser beam LB may be repeatedly emitted to the removal portion RMP and the second welding portion WP2 so that the second welding portion WP2 is removed (See FIG. 11C). After the removal portion RMP is removed by the laser beam LB, the second welding portion WP2 may be removed by the laser beam LB (See FIG. 11D).

An amount corresponding to the first depth DPH is repeatedly removed each time the laser beam LB is emitted once, and thus, the removal portion RMP and the second welding portion WP2 may be removed finally. The removal portion RMP and the second welding portion WP2 are removed by the laser beam LB, and thus, the defective cell mask B_CMK may be separated from an opening sheet OPS.

In a case where the removal portion RMP and the second welding portion WP2 are removed at once by increasing energy of the laser beam LB, the removal portion RMP and the second welding portion WP2 may not be precisely removed. However, in a case where the removal portion RMP and the second welding portion WP2 are removed by providing the laser beam LB a plurality of times, the removal portion RMP and the second welding portion WP2 may be more precisely removed.

When the laser beam LB is emitted to the second welding portion WP2 to remove the second welding portion WP2, the laser beam LB may be emitted to the top surface of the opening sheet OPS. When the laser beam LB is emitted to the top surface of the opening sheet OPS, an oxide layer OXL may be formed, due to the laser beam LB, on the top surface of the opening sheet OPS that overlaps the second welding portion WP2.

The oxide layer OXL may include a material constituting the opening sheet OPS and an oxide. For example, a ratio of invar to the oxide is about 1:1 to about 1:0.9 in the oxide layer OXL formed on the top surface of the opening sheet OPS.

Figure 12:
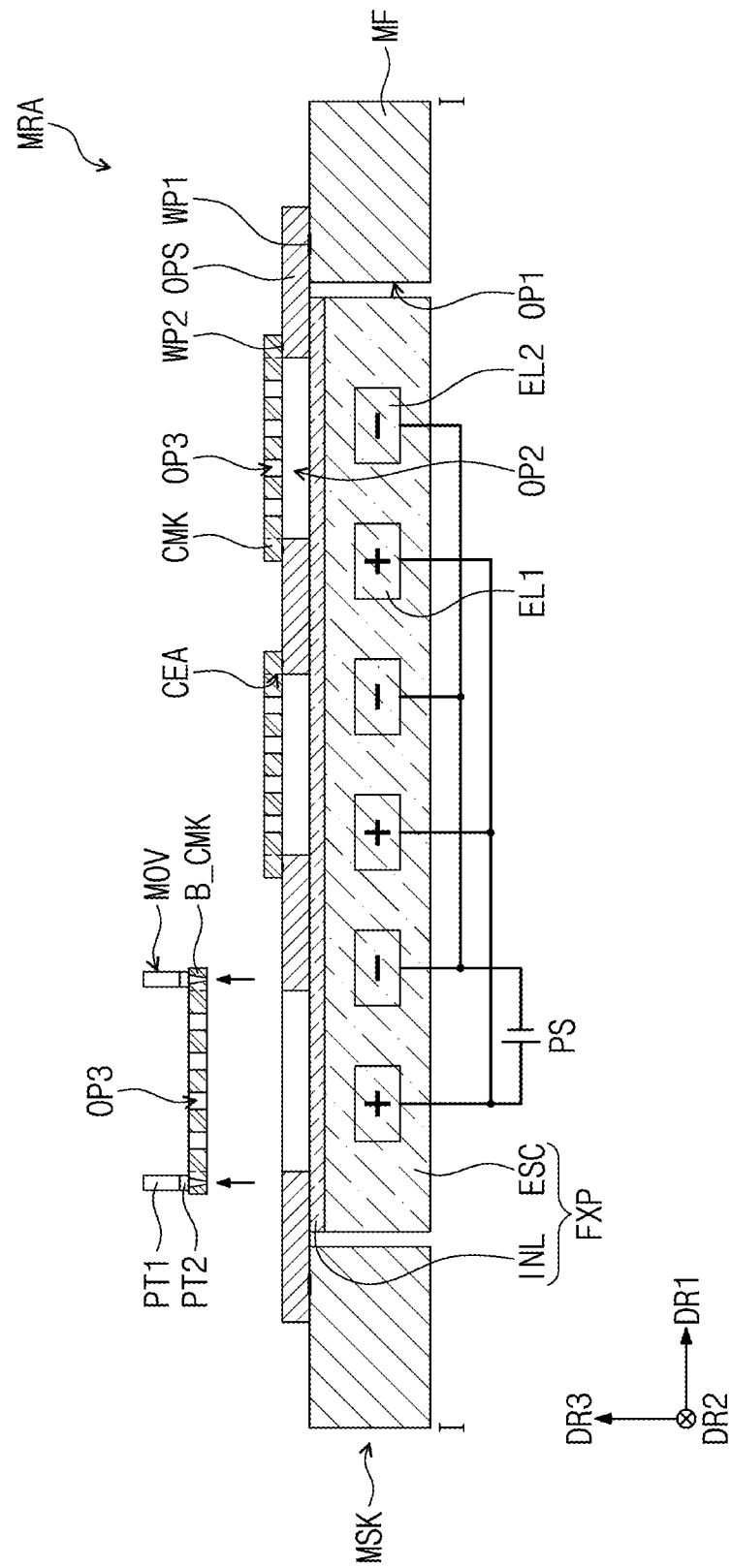

Referring to FIG. 12, conveying units MOV may be disposed above the defective cell mask B_CMK. The defective cell mask B_CMK separated from the opening sheet OPS may be conveyed by the conveying units MOV. The conveying units MOV may be adhered to the top surface of the defective cell mask B_CMK adjacent to the edge of the defective cell mask B_CMK.

The conveying units MOV may be adhered to the top surface of the defective cell mask B_CMK in a vacuum suction method. For example, although not illustrated, vacuum suction holes may be defined in the bottom surfaces of the conveying units MOV, and the vacuum suction holes may generate a suction force while maintaining a vacuum state. The defective cell mask B_CMK may be adhered to the bottom surfaces of the conveying units MOV by the suction force provided from the vacuum suction holes.

The defective cell mask B_CMK may be separated from the opening sheet OPS and then conveyed to the outside by the conveying units MOV. The defective cell mask B_CMK conveyed to the outside may be discarded.

Each of the conveying units MOV may include a first part PT1 and a second part PT2 positioned below the first part PT1. The first part PT1 may be more rigid than the second part PT2. The second part PT2 may have elasticity. The second part PT2 may be adhered to the defective cell mask B_CMK. For example, the first part PT1 may include metal, and the second part PT2 may include rubber.

Figure 13:
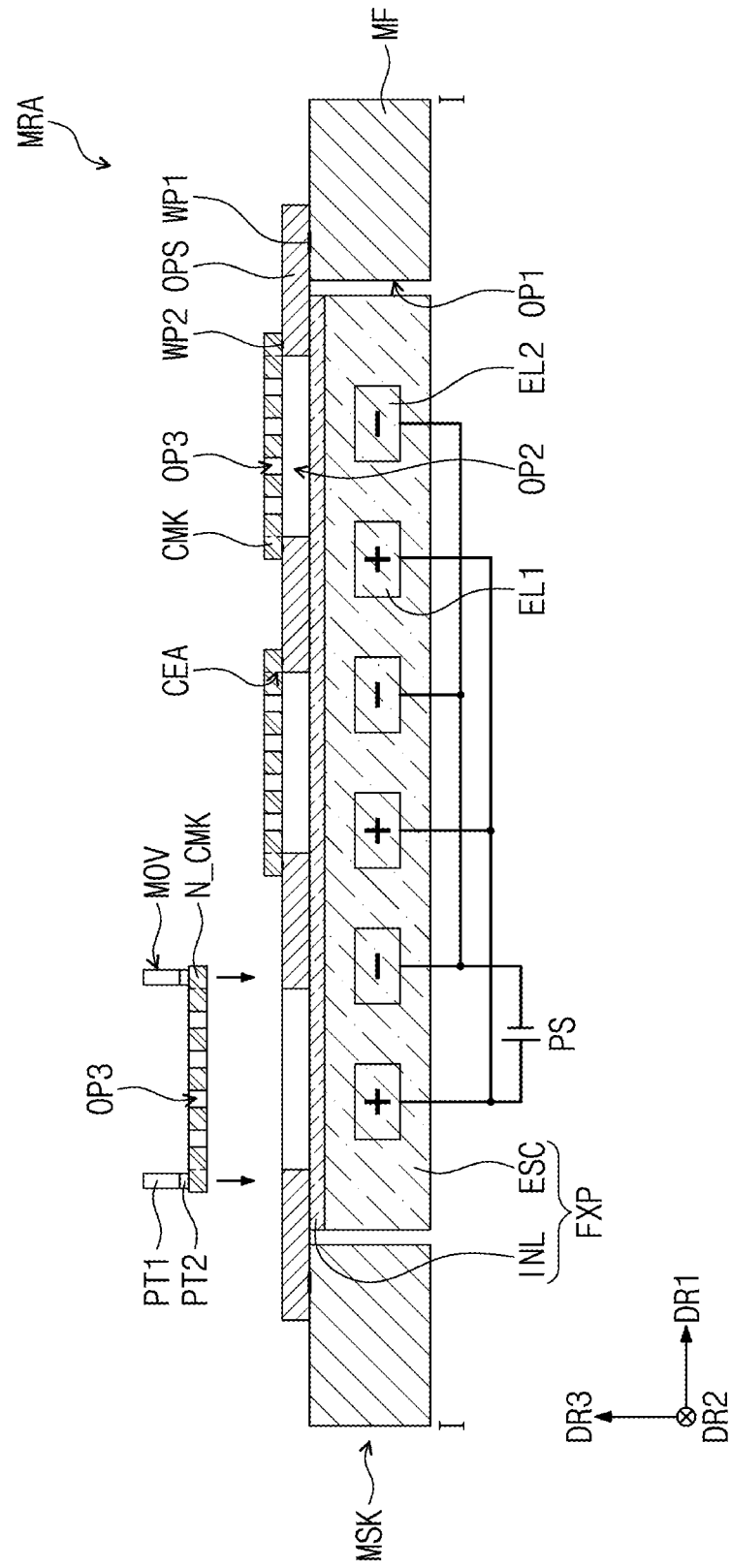

Referring to FIG. 13, the conveying units MOV may convey a normal cell mask N_CMK. In a case where the second part PT2 includes a rigid material such as metal, the top surface of the normal cell mask N_CMK may be damaged by the second part PT2. Since the second part PT2 according to an embodiment of the inventive concept includes an elastic material such as rubber, the top surface of the normal cell mask N_CMK may not be damaged when the second part PT2 comes into contact with the top surface of the normal cell mask N_CMK The normal cell mask N_CMK may be provided on the opening sheet OPS by the conveying units MOV. The normal cell mask N_CMK may be disposed on a corresponding second opening portion OP2 and connected to the opening sheet OPS. The normal cell mask N_CMK may be connected to the opening sheet OPS by laser welding.

Consequently, the defective cell mask B_CMK is replaced with the normal cell mask N_CMK by the mask repairing apparatus MRA, and thus, a mask MSK may be easily repaired.

Figure 14:
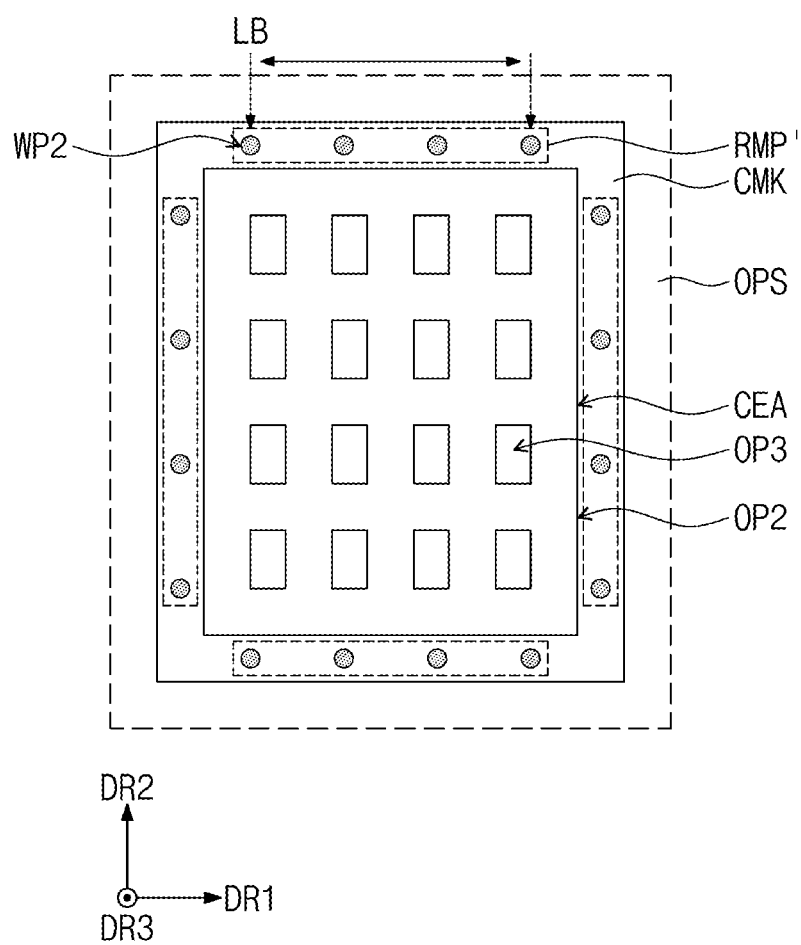
FIG. 14 is a view for explaining a mask repairing method according to another embodiment of the inventive concept.

FIG. 14 is a view for explaining a mask repairing method according to another embodiment of the inventive concept.

FIG. 14 illustratively shows a plan view corresponding to FIG. 8. A cell mask CMK illustrated in FIG. 14 may be a defective cell mask.

Referring to FIG. 14, removal portions RMP' may be defined in the cell mask CMK. That is, each removal portions RMP' in this embodiment has a rod shape to overlap several or all second welding portions WP2 disposed along one side of a cell mask CMK compared to that each removal portions RMP in FIG. 8 overlaps one second welding portions WP2. The plurality of removal portions RMP' may be defined on four sides of the cell mask CMK, respectively. The laser beam LB may be emitted to each of the removal portions RMP'.

Each of the removal portions RMP' and each of second welding portions WP2 overlapping the removal portions RMP' in a plan view may be removed by a laser beam LB. That is, the laser beam LB is emitted in common to the second welding portions WP2 arranged along one side of the cell mask CMK, and thus, the second welding portions WP2 arranged along the one side of the cell mask CMK may be removed all together.

Figure 15:
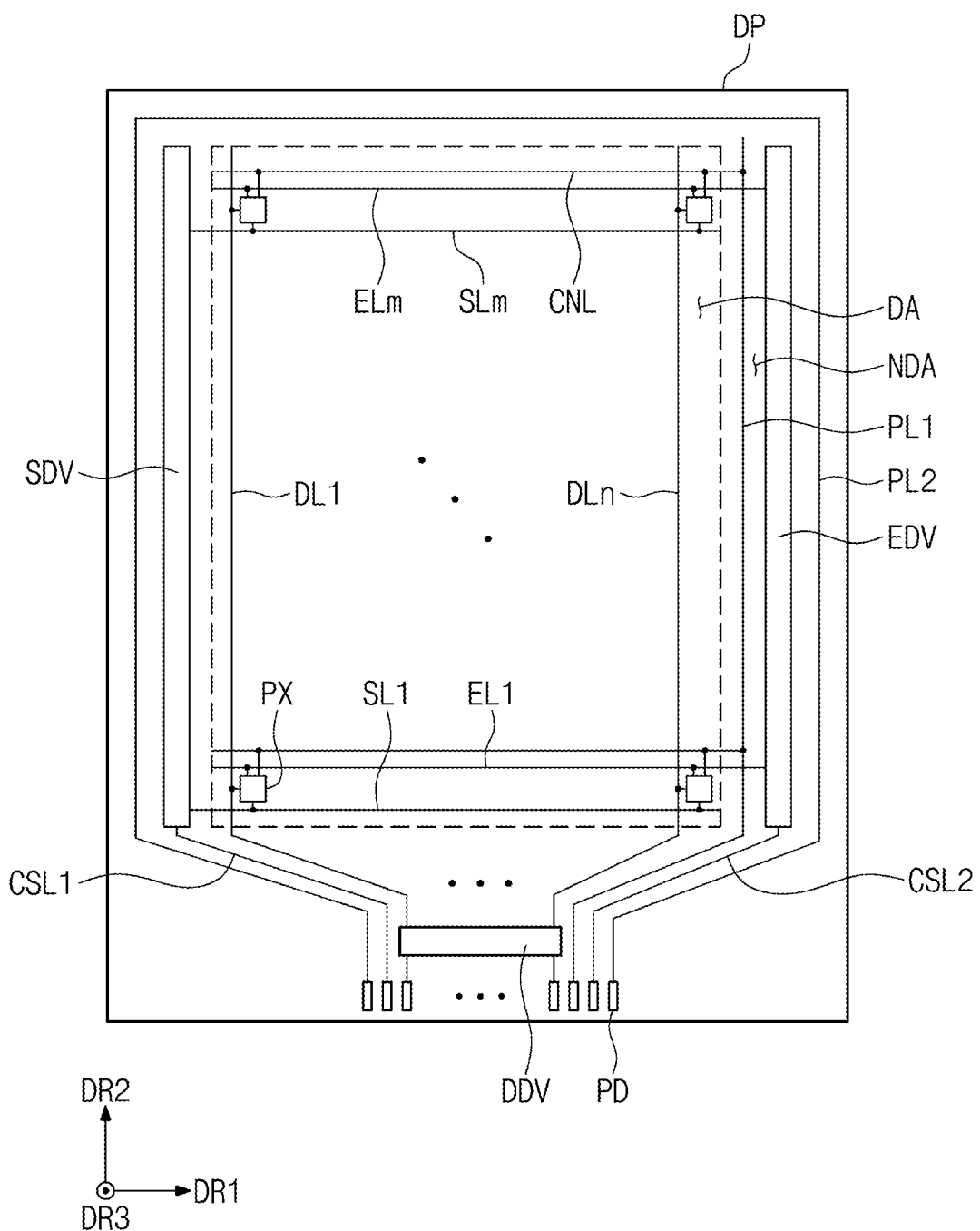
FIG. 15 is a plan view of a display panel manufactured by using the mask illustrated in FIG. 1.

FIG. 15 is a plan view of a display panel manufactured by using the mask illustrated in FIG. 1.

Referring to FIG. 15, a display panel DP may have a rectangular shape having long sides (i.e., longitudinal sides) in a first direction DR2 and having short sides (i.e., latitudinal sides) in a second direction DR1, but the shape of the display panel DP according to the invention is not limited thereto. The display panel DP may include a display portion DA and a non-display portion NDA surrounding the display portion DA.

The display panel DP may be a light emission-type display panel. The display panel DP may be an organic light emitting display panel or a quantum-dot light emitting display panel. A light emitting layer of the organic light emitting display panel may include an organic light emitting material. A light emitting layer of the quantum-dot light emitting display panel may include quantum dots, quantum rods, or the like. Hereinafter, the display panel DP is described as the organic light emitting display panel.

The display panel DP may include a plurality of pixels PX, a plurality of scan lines SL1 to SLm, a plurality of data lines DL1 to DLn, a plurality of light emission lines EL1 to Elm, first and second control lines CSL1 and CSL2, first and second power lines PL1 and PL2, connection lines CNL, and a plurality of pads PD. Here, m and n are natural numbers.

The pixels PX may be disposed in the display portion DA. A scan driver SDV and a light emission driver EDV may be disposed in the non-display portion NDA adjacent to the long sides (i.e., longitudinal sides) of the display panel DP, respectively. A data driver DDV may be disposed in the non-display portion NDA adjacent to one of the short sides (i.e., latitudinal sides) of the display panel DP. When viewed in a plan view, the data driver DDV may be adjacent to a lower end of the display panel DP.

The scan lines SL1 to SLm may extend in the first direction DR1 and be connected to the pixels PX and the scan driver SDV. The data lines DL1 to DLn may extend in the second direction DR2 and be connected to the pixels PX and the data driver DDV. The light emission lines EL1 to ELm may extend in the first direction DR1 and be connected to the pixels PX and the light emission driver EDV.

The first power line PL1 may extend in the second direction DR2 and be disposed in the non-display portion NDA. The first power line PL1 may be disposed between the display portion DA and the light emission driver EDV, but the embodiment of the inventive concept is not limited thereto. The first power line PL1 may be disposed between the display portion DA and the scan driver SDV.

The connection lines CNL may extend in the first direction DR1 and be arranged in the second direction DR2. The connection lines CNL may be connected to the first power line PL1 and the pixels PX. A first voltage may be applied to the pixels PX through the first power line PL1 and the connection lines CNL which are connected to each other.

The second power line PL2 may be disposed in the non-display portion NDA. The second power line PL2 may extend along the long sides (i.e., longitudinal sides) of the display panel DP and another short side (i.e., latitudinal sides) of the display panel DP in which the data driver DDV is not disposed. The second power line PL2 may be disposed in the outside of the scan driver SDV and the light emission driver EDV.

Although not illustrated, the second power line PL2 may extend toward the display portion DA and be connected to the pixels PX. A second voltage having a lower level than the first voltage may be applied to the pixels PX via the second power line PL2.

The first control line CSL1 may be connected to the scan driver SDV and extend toward the lower end of the display panel DP when viewed in a plan view. The second control line CSL2 may be connected to the light emission driver EDV and extend toward the lower end of the display panel DP when viewed in a plan view. The data driver DDV may be disposed between the first control line CSL1 and the second control line CSL2.

The pads PD may be disposed on the display panel DP. The pads PD may be disposed closer to the lower end of the display panel DP than is the data driver DDV. The data driver DDV, the first power line PL1, the second power line PL2, the first control line CSL1, and the second control line CSL2 may be connected to the pads PD. The data lines DL1 to DLn may be connected to the data driver DDV, and the data driver DDV may be connected to the pads PD which correspond to the data lines DL1 to DLn.

Each of the cell areas CEA illustrated in FIG. 1 may correspond to the display panel DP illustrated in FIG. 15. Light emitting elements of one display panel DP may be formed by the one cell area CEA. Light emitting elements of a plurality of display panels DP may be formed by the cell masks CMK.

Although not illustrated, a timing controller for controlling the operations of the scan driver SDV, the data driver DDV, and the light emission driver EDV and a voltage generation unit for generating the first and second voltages may be disposed on a printed circuit board. The timing controller and the voltage generation unit may be connected to the corresponding pads PD via the printed circuit board.

The scan driver SDV generates a plurality of scan signals, and the scan signals may be applied to the pixels PX through the scan lines SL1 to SLm. The data driver DDV generates a plurality of data voltages, and the data voltage may be applied to the pixels PX through the data lines DL1 to DLn. The light emission driver EDV generates a plurality of light emission signals, and the light emission signals may be applied to the pixels PX through the light emission lines EL1 to Elm.

The pixels PX may receive the data voltages in response to the scan signals. The pixels PX may emit light, having luminance corresponding to the data voltages, in response to the light emission signals, thereby displaying an image. Light emission times of the pixels PX may be controlled by the light emission signals.

Figure 16:
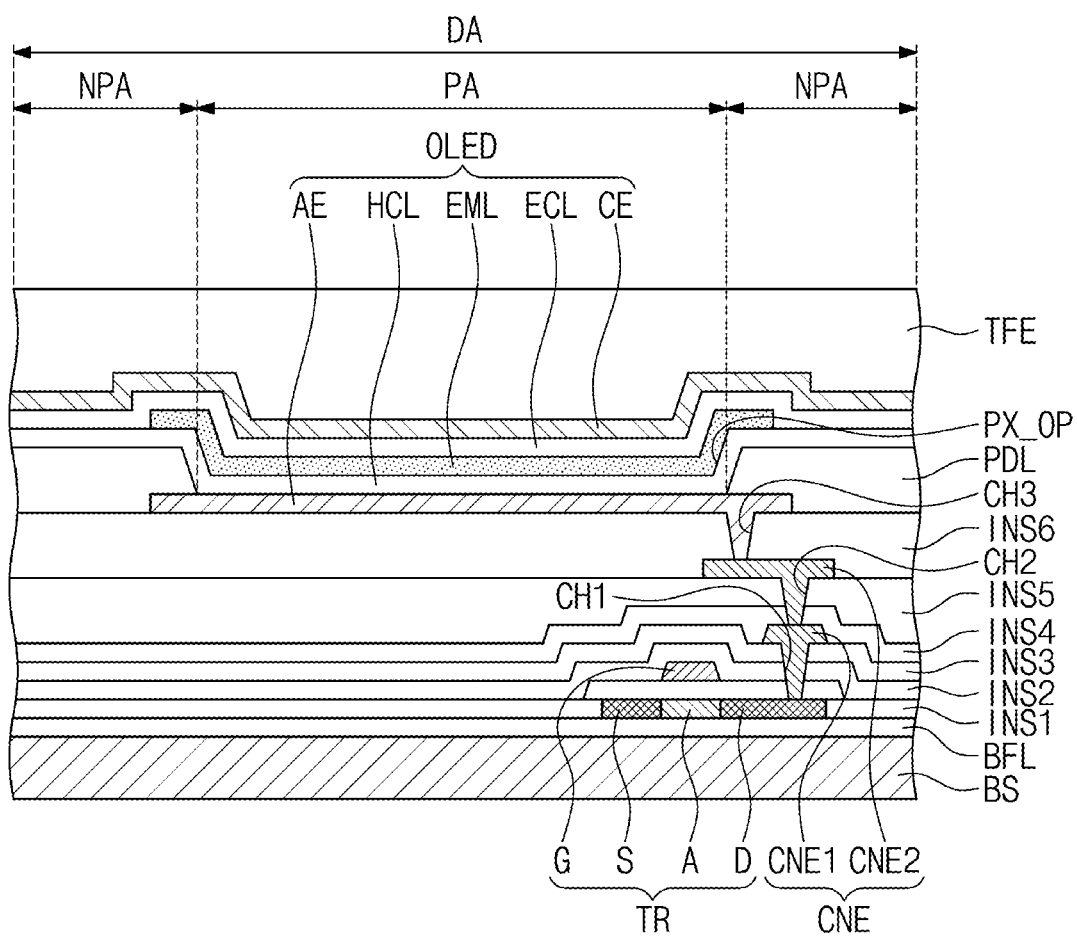
FIG. 16 is a view illustratively showing a cross-section of one of pixels illustrated in FIG. 15.

FIG. 16 is a view illustratively showing a cross-section of one of pixels illustrated in FIG. 15.

Referring to FIG. 16, the pixel PX may be disposed on a base substrate BS and include a transistor TR and a light emitting element OLED. The light emitting element OLED may include a first electrode AE, a sensing electrode CE, a hole control layer HCL, an electron control layer ECL, and a light emitting layer EML. The first electrode AE may be an anode electrode, and the second electrode CE may be a cathode electrode.

The transistor TR and the light emitting element OLED may be disposed on the base substrate BS. One transistor TR is illustratively shown in the drawing, but substantially, the pixel PX may include a plurality of transistors and at least one capacitor to drive the light emitting element OLED.

The display portion DA may include a light emitting portion PA corresponding to the pixel PX and a non-light emitting portion NPA around the light emitting portion PA. The light emitting element OLED may be disposed in the light emitting portion PA.

The base substrate BS may include a flexible plastic substrate. For example, the base substrate BS may include transparent polyimide ("PI"). A buffer layer BFL may be disposed on the base substrate BS, and the buffer layer BFL may be an inorganic layer.

A semiconductor pattern is disposed on the buffer layer BFL. The semiconductor pattern may include polysilicon. However, the embodiment of the inventive concept is not limited thereto, and the semiconductor pattern may include amorphous silicon or a metal oxide in another embodiment.

The semiconductor pattern may be doped with an N-type dopant or a P-type dopant. The semiconductor pattern may include a highly-doped area and a lightly-doped area. The highly-doped area may have conductivity higher than that of the lightly-doped area, and substantially serve as a source electrode and a drain electrode of the transistor TR. The lightly-doped area may substantially correspond to an active (i.e., a channel) of the transistor TR.

A source S, an active A, and a drain D of the transistor TR may be provided in the semiconductor pattern. A first insulating layer INS1 may be disposed on the semiconductor pattern. A gate G of the transistor TR may be disposed on the first insulating layer INS'. A second insulating layer INS2 may be disposed on the gate G. A third insulating layer INS3 may be disposed on the second insulating layer INS2.

A connection electrode CNE may be disposed between the transistor TR and the light emitting element OLED and connect the transistor TR to the light emitting element OLED. The connection electrode CNE may include a first connection electrode CNE1 and a second connection electrode CNE2.

The first connection electrode CNE1 may be disposed on the third insulating layer INS3 and connected to the drain D through a first contact hole CH1 defined in the first to third insulating layers INS' to INS3. A fourth insulating layer INS4 may be disposed on the first connection electrode CNE1. A fifth insulating layer INS5 may be disposed on the fourth insulating layer INS4.

The second connection electrode CNE2 may be disposed on the fifth conductive layer INS5. The second electrode CNE2 may be connected to the first connection electrode CNE1 through a second contact hole CH2 defined in the fifth insulating layer INS5. A sixth insulating layer INS6 may be disposed on the second connection electrode CNE2. Each of the first insulating layer INS1 to the sixth insulating layer INS6 may be an inorganic layer or an organic layer.

The first electrode AE may be disposed on the sixth insulating layer INS6. The first electrode AE may be connected to the second connection electrode CNE2 through a third contact hole CH3 defined in the sixth insulating layer INS6. A pixel defining layer PDL that exposes a predetermined portion of the first electrode AE may be disposed on the first electrode AE and the sixth insulating layer INS6. An opening portion PX_OP for exposing the predetermined portion of the first electrode AE may be defined in the pixel defining PDL.

The hole control layer HCL may be disposed on the first electrode AE and the pixel defining layer PDL. A hole control layer HCL may be disposed in common in the light emitting portion PA and the non-light emitting portion NPA.

The hole control layer HCL may include a hole transport layer and a hole injection layer.

The light emitting layer EML may be disposed on the hole control layer HCL. The light emitting layer EML may be disposed in an area corresponding to the opening portion PX_OP. The light emitting layer EML may include an organic material and/or an inorganic material. The light emitting layer EML may generate one of red, green, or blue light.

The electron control layer ECL may be disposed on the light emitting layer EML and the hole control layer HCL. The electron control layer ECL may be disposed in common in the light emitting portion PA and the non-light emitting portion NPA. The electron control layer ECL may include an electron transport layer and an electron injection layer.

The second electrode CE may be disposed on the electron control layer ECL. The second electrode CE may be disposed in common in the pixels PX. A pixel layer PXL may be defined as the layers from the buffer layer BFL to the light emitting element OLED.

A thin film encapsulation layer TFE may be disposed on the light emitting element layer OLED. The thin film encapsulation layer TFE may be disposed on the second electrode CE to cover the pixels PX. The thin film encapsulation layer TFE may include at least two inorganic layers and an organic layer between the inorganic layers. The inorganic layers may protect the pixel PX from moisture/oxygen. The organic layer may protect the pixel PX from impurities such as dust particles.

The first voltage may be applied to the first electrode AE through the transistor TR, and the second voltage having a level lower than that of the first voltage may be applied to the second electrode CE. A hole and an electron injected into the light emitting layer EML are coupled to each other to form an exciton, and while the exciton is transited to a ground state, the light emitting element OLED may emit light.

Figure 17:
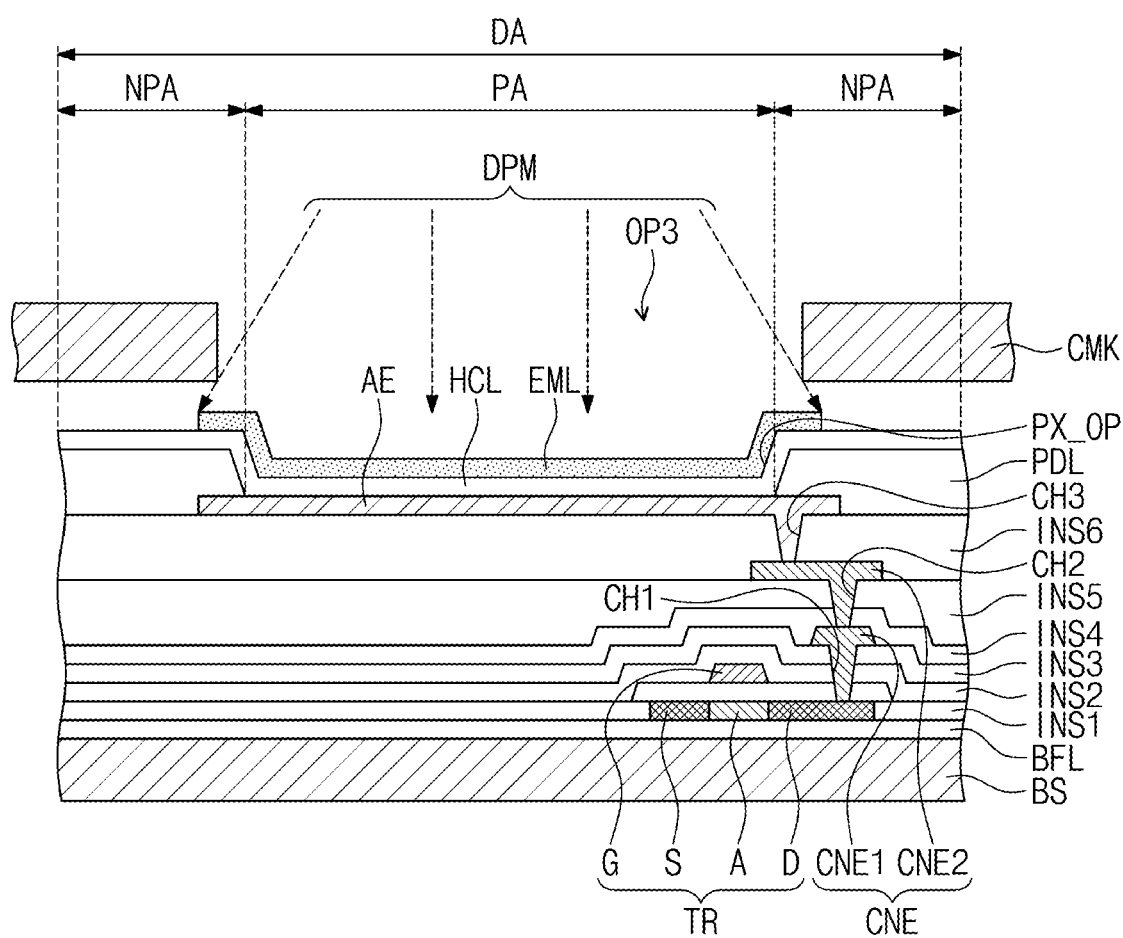
FIG. 17 is a view for explaining a deposition process in which the mask illustrated in FIG. 1 is used.

FIG. 17 is a view for explaining a deposition process in which the mask illustrated in FIG. 1 is used.

FIG. 17 illustratively shows one third opening portion OP3 of a cell mask CMK.

Referring to FIG. 17, the cell mask CMK may be disposed on a base substrate BS. A hole control layer HCL may be disposed on a first electrode AE, and the cell mask CMK may be used to form a light emitting layer EML on the hole control layer HCL.

A deposition material DPM may be provided on the hole control layer HCL via a third opening portion OP3 defined in the cell mask CMK. The light emitting layer EML may be formed by the deposition material DPM.

According to the embodiment of the inventive concept, the welding portion between the defective cell mask and the opening sheet is removed by the laser. Accordingly, the defective cell mask may be easily removed from the opening sheet, and the normal cell mask may be connected to the opening sheet.

Although the embodiments of the present disclosure have been described, it is understood that various changes and modifications can be made by one ordinary skilled in the art within the spirit and scope of the present disclosure as hereinafter claimed. Also, the embodiments disclosed in the present disclosure are not intended to limit the technical ideas of the present disclosure, and all technical ideas within the following claims and their equivalents should be interpreted to be included in the scope of right in the present disclosure.

What is claimed is:

1. A mask repairing apparatus comprising:
    a laser which emits a laser beam toward an existing welding portion between an opening sheet disposed on a mask frame and a cell mask disposed on the opening sheet;
    a fixing part disposed below the opening sheet to fix the opening sheet; and
    a suction part adjacent to the laser,
    wherein the laser beam is configured to remove the existing welding portion.

2. The mask repairing apparatus of claim 1, wherein the welding portion is adjacent to an edge of the cell mask.

3. The mask repairing apparatus of claim 1, wherein the laser is disposed above the cell mask and emits the laser beam to the welding portion and a removal portion of the cell mask which overlaps the welding portion in a plan view.

4. The mask repairing apparatus of claim 3, wherein the removal portion and the welding portion are removed by the laser beam.

5. The mask repairing apparatus of claim 4, wherein the suction part suctions particles that are produced when the removal portion and the welding portion are removed.

6. The mask repairing apparatus of claim 3, wherein the cell mask has a thickness in a thickness direction, and
    the removal portion is repeatedly removed by a one-time-removal depth less than the thickness in the thickness direction each time the laser beam is emitted once to an entire area of the removal portion.

7. The mask repairing apparatus of claim 6, wherein the thickness is about 10 micrometers to about 25 micrometers, and
    the one-time-removal depth is about 0.1 micrometers to about 5 micrometers.

8. The mask repairing apparatus of claim 3, wherein the laser emits the laser beam to the removal portion by reciprocating the laser beam in a first direction.

9. The mask repairing apparatus of claim 8, wherein the laser emits the laser beam to the removal portion by further reciprocating the laser beam in a second direction crossing the first direction.

10. The mask repairing apparatus of claim 3, wherein the opening sheet comprises an invar, and
    a ratio of the invar to an oxide is about 1:1 to about 1:0.9 in an oxide layer formed on a top surface of the opening sheet that overlaps the welding portion.

11. The mask repairing apparatus of claim 1, further comprising a conveying unit disposed above the cell mask,
    wherein the cell mask is separated from the opening sheet by the laser beam, and the conveying unit conveys the cell mask separated from the opening sheet.

12. The mask repairing apparatus of claim 11, wherein the conveying unit comprises:
    a first part; and
    a second part which is disposed below the first part, has elasticity, and suctions the cell mask.

13. The mask repairing apparatus of claim 1, wherein a first opening portion is defined in the mask frame,
    a second opening portion overlapping the first opening portion in a plan view is defined in the opening sheet, and
    a plurality of third opening portions overlapping the second opening portion in the plan view is defined in the cell mask,
    wherein the fixing part is disposed in the first opening portion.

14. The mask repairing apparatus of claim 1, wherein the fixing part comprises:
    an electrostatic chuck; and
    an insulating layer disposed on the electrostatic chuck.

15. The mask repairing apparatus of claim 1, wherein the fixing part comprises:
    a magnet; and
    an insulating layer disposed on the magnet.

16. The mask repairing apparatus of claim 1, wherein the laser comprises one of a green laser, a femtosecond laser, or a picosecond laser.

17. The mask repairing apparatus of claim 1, wherein the welding portion is provided in plurality, and
    the laser beam is sequentially emitted to the plurality of welding portions and removal portions of the cell mask, which overlap the plurality of welding portions in a plan view.

18. A mask repairing method comprising:
    disposing a fixing part, which is to fix an opening sheet, in a first opening portion defined in a mask frame, wherein the mask frame is disposed below the opening sheet;
    removing a removal portion of a defective cell mask by emitting a laser beam toward the removal portion which overlaps a welding portion between the opening sheet and the defective cell mask disposed on the opening sheet;
    removing the welding portion by emitting the laser beam to the welding portion;
    separating the defective cell mask from the opening sheet; and
    connecting a normal cell mask to the opening sheet.

19. The mask repairing method of claim 18, wherein the defective cell mask has a thickness in a thickness direction, and
    the removal portion is repeatedly removed by a one-time-removal depth less than the thickness in the thickness direction each time the laser beam is emitted once to an entire area of the removal portion.

20. The mask repairing method of claim 19, wherein the thickness is about 10 micrometers to about 25 micrometers, and the one-time-removal depth is about 0.1 micrometers to about 5 micrometers,
    wherein the opening sheet comprises an invar, and a ratio of the invar to an oxide film is about 1:1 to about 1:0.9 in an oxidized portion of the opening sheet that overlaps the welding portion.

* * * * *